(12) United States Patent
Frisina et al.

(10) Patent No.: US 7,569,883 B2
(45) Date of Patent: Aug. 4, 2009

(54) SWITCHING-CONTROLLED POWER MOS ELECTRONIC DEVICE

(75) Inventors: Ferruccio Frisina, Sant' Agata Li Battiati (IT); Giuseppe Ferla, Acicastello (IT); Angelo Magri, Belpasso (IT); Antonio Giuseppe Grimaldi, San Giovanni La Punta (IT); Gaetano Bazzano, Floridia (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/285,759

(22) Filed: Nov. 21, 2005

(65) Prior Publication Data

US 2006/0220121 A1    Oct. 5, 2006

(30) Foreign Application Priority Data

Nov. 19, 2004  (IT) ............................ MI2004A2243
Nov. 19, 2004  (IT) ............................ MI2004A2244
Nov. 19, 2004  (IT) ............................ MI2004A2245

(51) Int. Cl.
  *H01L 29/76*  (2006.01)
  *H01L 29/94*  (2006.01)
  *H01L 21/336* (2006.01)

(52) U.S. Cl. ............... 257/341; 257/401; 257/E29.105; 257/E29.112; 438/284; 438/286

(58) Field of Classification Search ............... 257/341, 257/401, 342, 343
See application file for complete search history.

(56) References Cited

U.S. PATENT DOCUMENTS

| 4,145,700 | A |   | 3/1979  | Jambotkar |
| 4,318,759 | A |   | 3/1982  | Trenary et al. |
| 5,254,494 | A |   | 10/1993 | Van Der Plas et al. |
| 5,445,978 | A | * | 8/1995  | Yilmaz ........................ 438/454 |
| 5,510,281 | A |   | 4/1996  | Ghezzo et al. |
| 5,814,859 | A |   | 9/1998  | Ghezzo et al. |
| 5,933,734 | A | * | 8/1999  | Ferla et al. .................. 438/268 |

(Continued)

FOREIGN PATENT DOCUMENTS

WO    WO 99/33119 A    7/1999

OTHER PUBLICATIONS

Shenai k et al.: "Selectively Silicided Vertical Power Dougle-Diffused Metal Oxide Semiconductor Field Effect Transistors for High Frequence Power Switchting Applications". Journal of Vacuum Science and technology Part B. vole 6, No. 6 Nov. 1988. pp. 1740-1745.*

(Continued)

*Primary Examiner*—Theresa T Doan
*Assistant Examiner*—Sarah K Salerno
(74) *Attorney, Agent, or Firm*—Graybeal Jackson LLP

(57) ABSTRACT

Power electronic MOS device of the type comprising a plurality of elementary power MOS transistors and a gate structure comprising a plurality of conductive strips realized with a first conductive material such as polysilicon, a plurality of gate fingers or metallic tracks connected to a gate pad and at least a connection layer arranged in series to at least one of said conductive strip. Such gate structure comprising at least a plurality of independent islands formed on the upper surface of the conductive strips and suitably formed on the connection layers. Said islands being realized with at least one second conductive material such as silicide.

12 Claims, 11 Drawing Sheets

U.S. PATENT DOCUMENTS

| | | | |
|---|---|---|---|
| 5,981,343 | A | 11/1999 | Magri et al. |
| 6,215,152 | B1 | 4/2001 | Herbert |
| 6,222,232 | B1 | 4/2001 | Magri et al. |
| 6,326,271 | B2 | 12/2001 | Magri et al. |
| 6,423,986 | B1 | 7/2002 | Zhao |
| 6,596,609 | B2 | 7/2003 | Cheng et al. |
| 6,979,863 | B2 | 12/2005 | Ryu |
| 2002/0093033 | A1* | 7/2002 | Zommer et al. ............. 257/202 |
| 2002/0140042 | A1 | 10/2002 | Stout |
| 2003/0057497 | A1* | 3/2003 | Higashida et al. ........... 257/356 |
| 2004/0031981 | A1 | 2/2004 | Grivna |
| 2004/0142531 | A1 | 7/2004 | Chan et al. |
| 2004/0185646 | A1 | 9/2004 | Herzum |
| 2005/0145852 | A1* | 7/2005 | Kumar et al. ................ 257/77 |
| 2006/0086974 | A1* | 4/2006 | Balakrishnan .............. 257/342 |

OTHER PUBLICATIONS

Patent Abstract of Japan vol. 1997, No. 07, Jul. 31, 1997 JP 09 082965 A, Mar. 28, 1997, Yokogawa Electric Corp.
European Search Report for EP 05 02 5288 dated Feb. 21, 2006.
Shenai k et al.: "Selectively Silicided Vertical Power Double-Diffused Metal-Oxide Semiconductor Field Effect Transistors for High-Frequency Power Switching Applications", Journal of Vacuum Science and technology Part B, vol. 6, No. 6, Nov. 1988, pp. 1740-1745.
European Search Report for EP 05 02 5285 dated Mar. 3, 2006.
European Search Report for EP 05 02 5287 dated May 29, 2006.
Berger, Wayne, et al., RF-LDMOS: A Device Technology for High Power RF Infrastructure Applications, XP010767463, IEEE pp. 189-192, Oct. 24, 2004.
Antipov I, Mask-Independent Short Channel MOS, XP000671029, IBM Technical Disclosure bulletin, vol. 21, No. 12, pp. 4852-4854, May 1, 1979.

* cited by examiner

Fast / Medium / Slow

-------- Rb   — - — Ra(x)   ——— Rtot

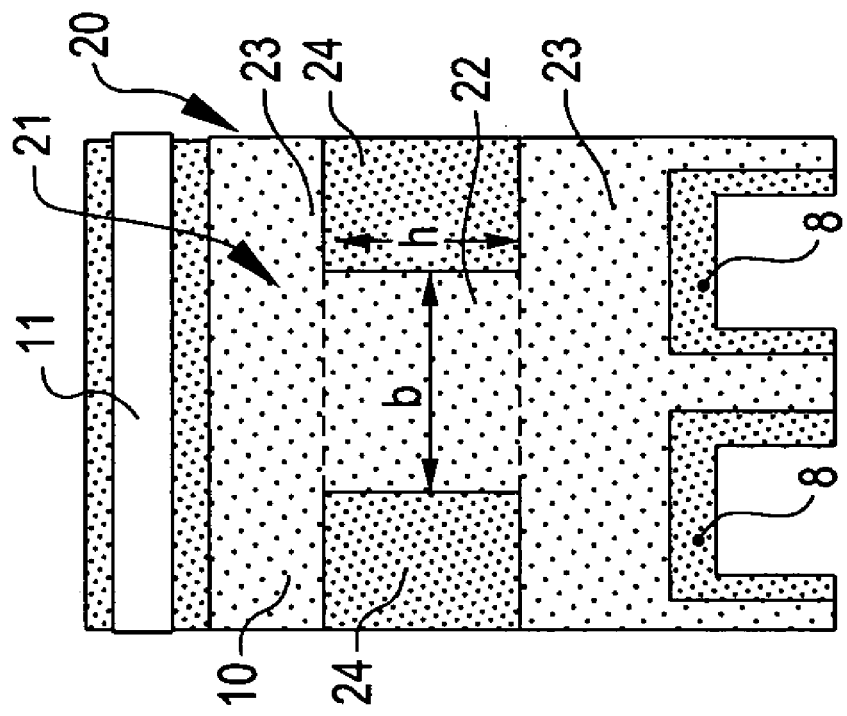
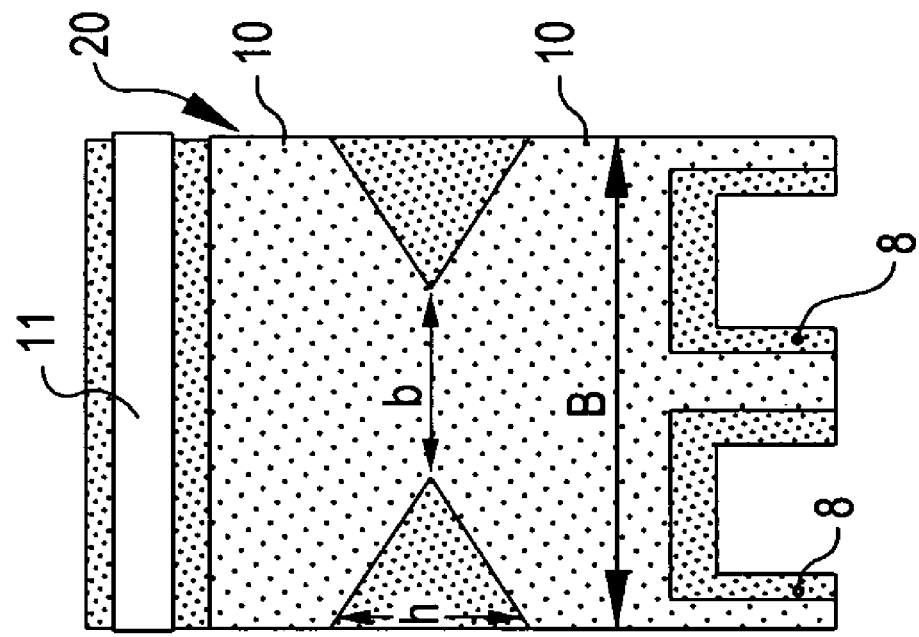
FIG. 19a
FIG. 19

SWITCHING-CONTROLLED POWER MOS ELECTRONIC DEVICE

PRIORITY CLAIM

This application claims priority from Italian patent application Nos. MI2004A 002244, filed Nov. 19, 2004, MI2004A 002245, filed Nov. 19, 2004, and MI2004A 002243, filed Nov. 19, 2004, which are incorporated herein by reference.

CROSS REFERENCE TO RELATED APPLICATIONS

This application is related to U.S. patent application Ser. Nos. 11/285,741 and 11/285,742 entitled POWER MOS ELECTRONIC DEVICE AND CORRESPONDING REALIZING METHOD and METHOD FOR MANUFACTURING A HIGH INTEGRATION DENSITY POWER MOS DEVICE, which have a common filing date and owner and which are incorporated by reference.

TECHNICAL FIELD

The present invention relates generally to a power electronic device, such as a MOS device, of the type comprising a very high integration of elementary MOS transistors and used in multiple applications both at low and high supply voltage.

The invention particularly, but not exclusively, relates to an electronic power MOS device and the following description is made with reference to this field of application by way of illustration only.

BACKGROUND

As it is well known, in power electronic devices, in particular in power devices of the MOS type, it is important to have the possibility of operating at higher and higher frequencies while maintaining a high component reliability.

Nowadays the uses of MOS devices in fact often require the possibility of operating, both at low supply voltage (20-100V) and at high supply voltage (200-1000V), but, however, at higher and higher frequencies approaching one megahertz (MHz).

Power devices are thus subjected to very high voltage and current gradients during the transients and/or during the switchings, which may make the stresses to the device weakening the same burdensome and reduce its lifetime drastically.

As it is well known, some power MOS devices are realized by thousands or millions of elementary MOS transistors placed in parallel and individually contributing to the overall current capacity of the device.

Typically, elementary MOS transistors, as highlighted in FIG. 1, are realized on semiconductor or with polygonal cells or strips and they comprise a body region, which, in the case shown, is of the p type, formed on a suitable substrate, of the n type, and with a source region realized on top.

The body region, together with the source region, form a channel region covered by an insulating layer, for example a silicon oxide, and by a conductive layer, for example suitably doped polysilicon.

These two insulating and conductive layers represent, for each elementary MOS transistor, the gate dielectric and for the power MOS device they form a biasing mesh also called the gate mesh.

The gate mesh is connected to a terminal called gate pad and it allows the distributing of the signals inside the MOS device as well as the turning on and/or off all the elementary MOS transistors composing the power MOS device.

The gate mesh, due to the high polysilicon resistivity (>10 Ohm/$_{[square]}$), exhibits resistive contributions along the path which depend on the relative position with respect to the gate pad, as highlighted in the circuit of FIG. 2. This implies that gate resistance value of each elementary transistor also depends on the distance from the gate pad.

Thus, at each switching of the MOS device, each elementary MOS transistor responds with a time constant which will be distinct, being, as known, a function of the input capacitance and of the gate resistance.

The gate resistance is thus an important value because, together with the input capacity of the MOS device, forms an RC circuit whose time constant is one of the most important parameters influencing the switch speed of power electronic MOS devices. These latter devices, having to operate at higher and higher frequencies, require a more and more reduced time constant. Consequently, there is then an attempt to reduce the gate resistance and to make it homogeneous for the entire MOS device so as to ensure a good reliability even at high frequency.

To try and solve such problem, a known technique is that of carrying out a suitable metallization of the gate, a process including creating connection buses, also called gate fingers, realized in metallic material, so as to connect the gate pad to various points of the gate mesh by "short-circuiting" them, as shown in FIG. 3 and in the corresponding circuit of FIG. 4.

A related technique is that of increasing the number of gate fingers so as to intersect the gate mesh at a greater number of points.

Although advantageous in several aspects, such a solution exhibits different drawbacks, the main one being that the presence of the gate fingers realized in metallic material reduces the active area of the power MOS device, since below the gate fingers it is often not possible to integrate the elementary MOS transistors.

Moreover, a further drawback linked to the presence of the gate fingers is due to the fact that they may limit the number and the position of the wires connecting to the source pad, thus negatively affecting the output resistance of the power MOS device.

A further known solution to reduce the gate resistance provides the decrease of the gate mesh resistance by integrating there inside a highly conductive layer. Referring to FIG. 5, such a process makes use of metallic silicides, such as for example cobalt silicide ($CoSi_2$), platinum silicide (PtSi), titanium silicide ($TiSi_2$) or tungsten silicide ($WSi_2$), which exhibit a layer resistivity of about one order of magnitude lower with respect to that of the unsilicided polysilicon.

For power electronic MOS devices used in faster and faster applications with low gate resistance, problems, however, emerge linked to the great voltage and current gradients during the transients.

FIG. 5 highlights a pattern in parallel of a pair of elementary MOS transistors which exhibit different gate resistances according to the position wherein they are with respect to the gate pad and to the gate fingers.

The diagram in FIG. 6 shows how between elementary MOS transistors where there exists an unbalance in the resistance value, during a switching step of the MOS device, different wave forms are produced which distribute the current at stake in a non uniform way. In particular it can be verified how the current intensity I2 crossing the slowest component, undergoes sudden increases negatively affecting the uniformity of the time constant of the electronic MOS device.

Such behavior in the power MOS device is exponentially increased relative to an increase in the plurality of elementary MOS transistors. This, however, may jeopardize both the correct functionality and the operating lifetime of the MOS device itself.

For the manufacturing process used in the realization of a power electronic MOS device, it is inevitable that there are unbalances in the current flow. In fact it is good to remember that the distance between one gate finger and the other is around 200-2000 µm and in such space many elementary MOS transistors are disposed whose gate biasing occurs by means of the gate mesh. In such case the elementary MOS transistors closer to the gate fingers often will be the fastest while the others will often be slower and slower, as highlighted in FIG. 7.

Further unbalances are due to the fact that because for problems due to the assembling step it is often difficult to realize continuous and equidistant gate fingers. Thus, the power MOS device obtained will exhibit areas with different distances between the gate fingers, as shown in the example of FIG. 8, and this implies the presence of a gate resistance influenced by the area with a shorter distance between the gate fingers, since in the calculation of the total resistance of these parallel resistances the areas with higher resistance will have less weight.

Moreover, it is good to reveal that although the resistivity of the material used for realizing the gate fingers is low, it is possible that the lengths of the fingers is such as to introduce resistive contributions that are significant as compared with the total gate resistance of the power electronic MOS device especially if, for lowering the metallization mesh resistance, metallic silicides are used.

As highlighted in the example of FIG. 9 and in the associated circuit of FIG. 10, the areas in correspondence with the points A and B, although being near the gate finger, exhibit a different resistance in series due to the contribution of the gate finger section AB, which could have an even higher resistance than one Ohm, with a consequent unbalance between the different areas of the power MOS device.

Considering for example a width of the metallic tracks of the gate finger equal to 10-50 µm, a thickness of the metallic layer between 2-10 µm and fixing at 5 mm the width of an aluminum track, the values of the minimum resistance of the gate finger will be approximately equal to 0.3 Ohm and the highest equal to approximately 7 Ohm.

It is good to remember that, in a fast power MOS device there is often the need of having a total gate resistance less than or equal to 1 Ohm, and then the importance is understood of reducing or voiding the resistive contributions of the gate fingers.

All these causes lead to having power electronic MOS devices weakened by the presence of areas having different gate resistances with consequent negative effects on the switches and during the extreme dynamic stresses during which there are high values of dV/dt and/or dI/dt.

The unbalance can also cause current localizations that can cause the incorrect operation and/or the destruction of the power MOS device.

SUMMARY

Therefore, a need has arisen for a power electronic MOS device with a high integration density, comprising a plurality of elementary MOS transistors and with such a gate structure as to provide a substantially uniform resistance and thus a controlled switching and a substantially simultaneous time constant, exhibiting in the meantime such structural and functional characteristics as to overcome some or all of the drawbacks cited with reference to the prior art.

An embodiment of the invention makes more uniform the gate resistance seen from each elementary MOS as compared to prior MOS devices.

An embodiment of the present invention is a power MOS device comprising a plurality of elementary MOS transistors and a gate structure realized with a conductive material with programmable resistivity exhibiting a plurality of independent islands, suitably distributed and localized.

BRIEF DESCRIPTION OF THE DRAWINGS

Characteristics and advantages of the power electronic MOS device according to the invention will be apparent from the following description of embodiments given by way of indicative and non limiting example making reference to the annexed drawings.

Figure 8:
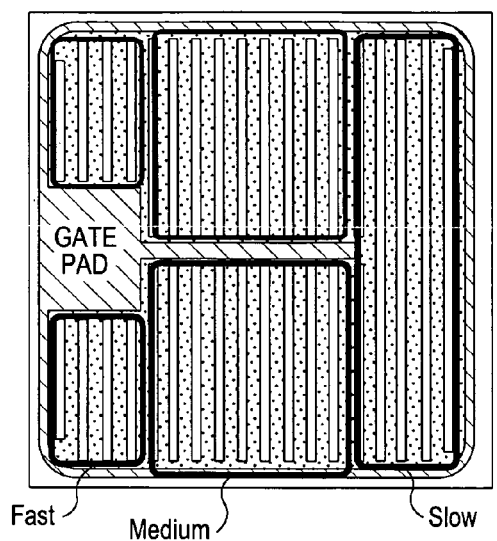
Figure 20:
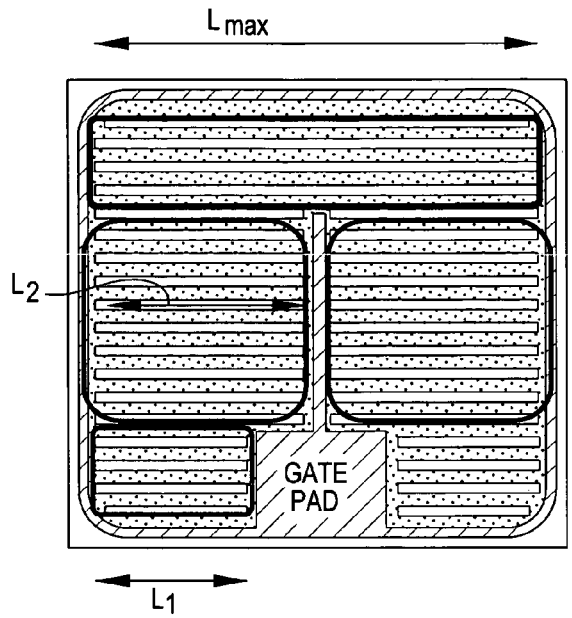
Figure 21:
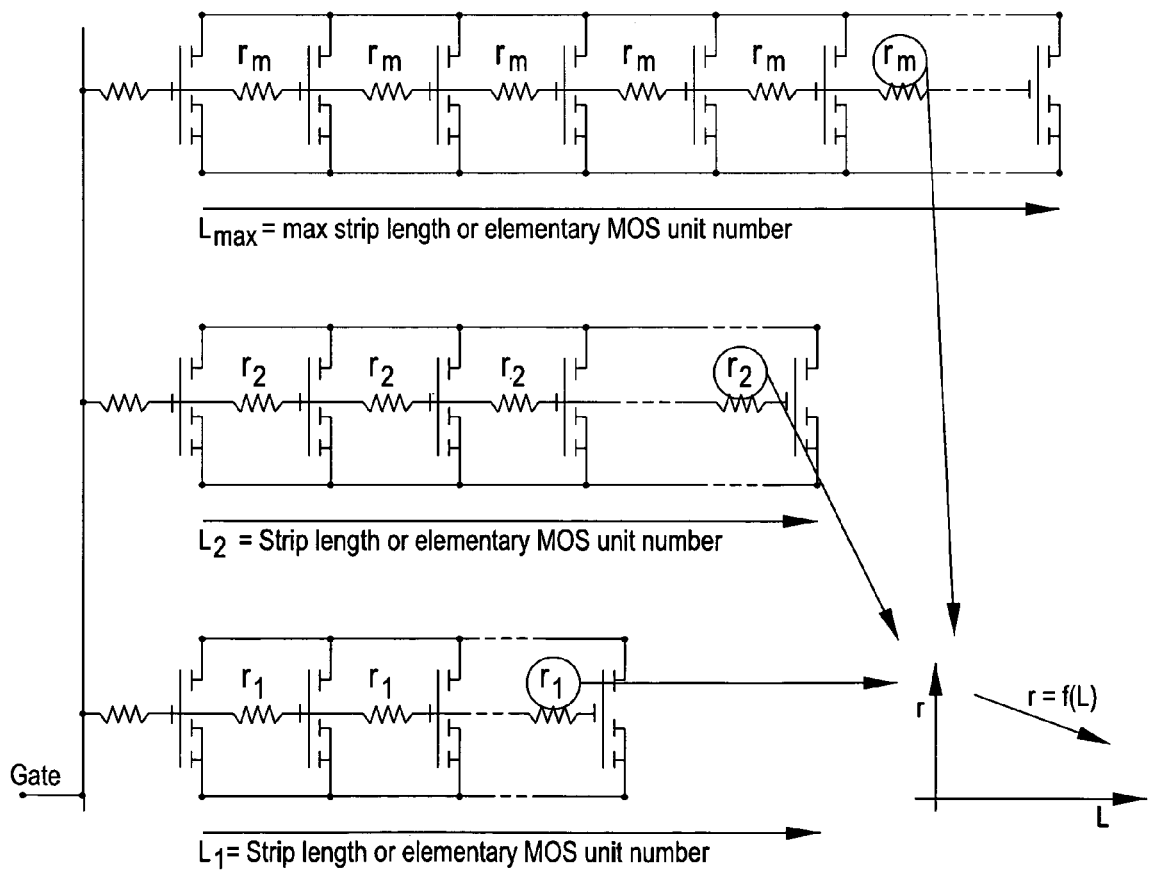

the series of FIGS. 17 to 19a show embodiments of a layout portion of a MOS device according to an embodiment of the present invention;

FIG. 20 proposes again the MOS device of FIG. 8 wherein some characteristic lengths have been highlighted;

FIG. 21 is a simplified electric representation of a series of elementary MOS transistors present in the device of FIG. 20 wherein the value of the resistance in series with the gate is modified according to an embodiment of the present invention.

DETAILED DESCRIPTION

Figure 1:
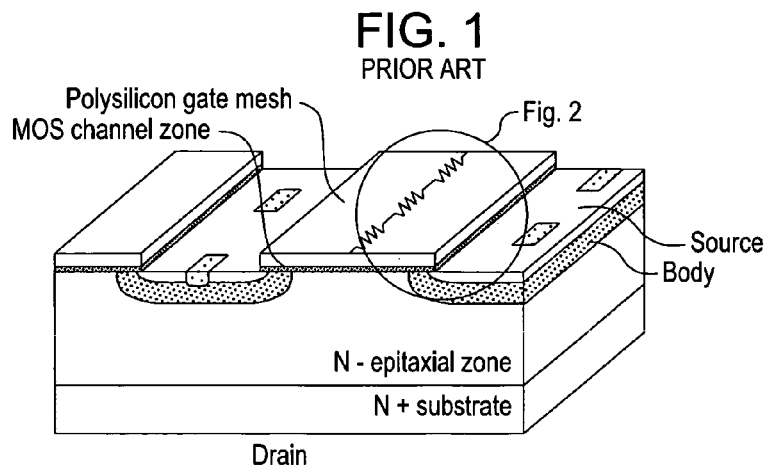
FIGS. 1 and 2 show a section, in an intermediate step of the manufacturing process, of a portion of a power MOS device realized according to the prior art and a corresponding equivalent electric circuit wherein the gate resistance due to the signal distribution by means of the polysilicon mesh (polysilicon gate mesh) is highlighted.
Figure 2:
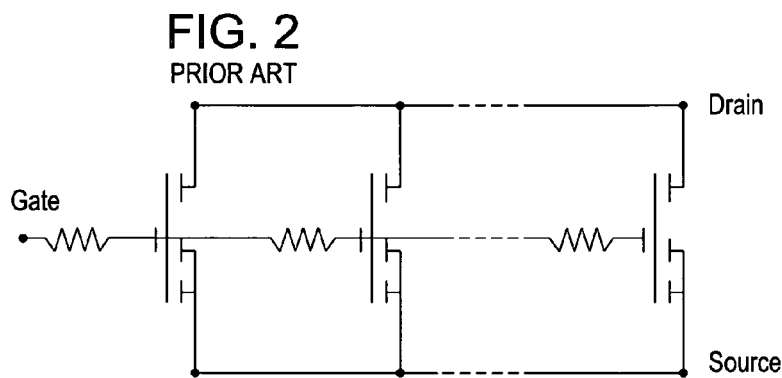
Figure 3:
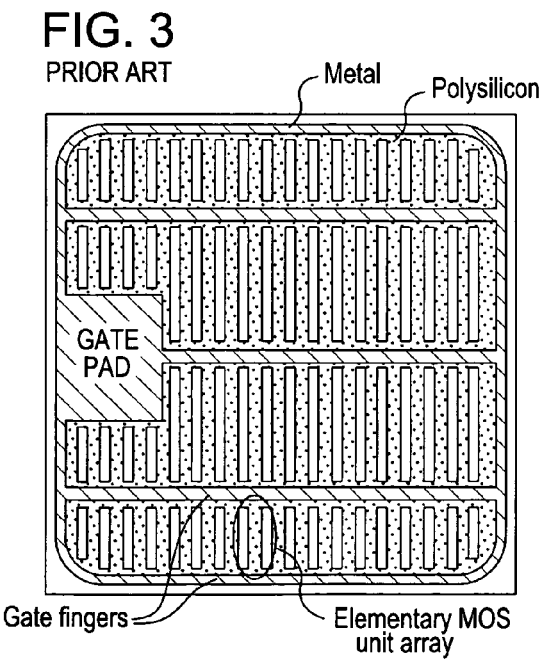
FIG. 3 shows, according to a flat view, the characteristic elements (gate pad, gate fingers, elementary MOS, etc.) of a power MOS device.
Figure 4:
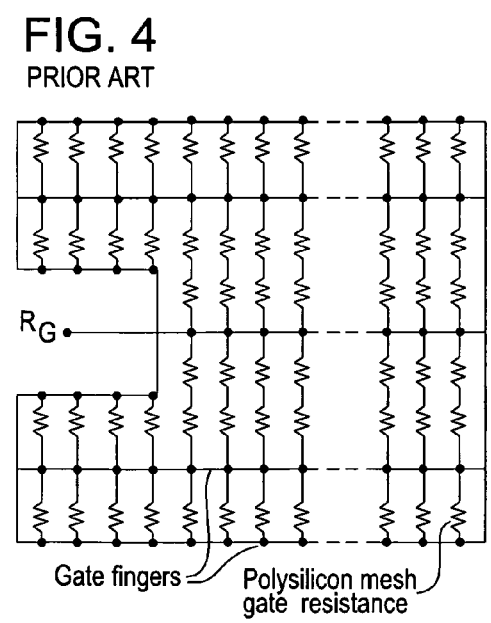
FIG. 4 shows the equivalent electric scheme of a gate mesh which departs from the gate pad to reach all the elementary MOS.
Figure 5:
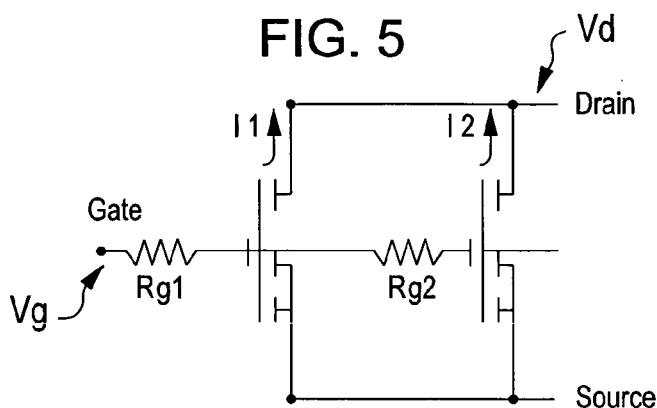
FIGS. 5 and 6 show an electric circuit and a diagram of the wave forms in voltage and current during a turning off of two elementary MOS transistors of a power MOS device realized according to the prior art.
Figure 6:
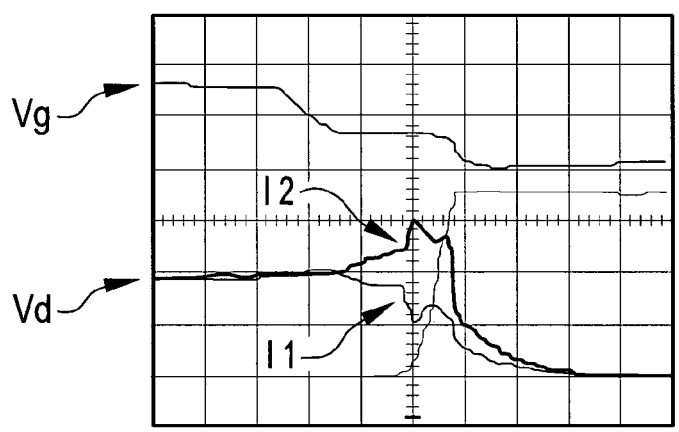
Figure 7:
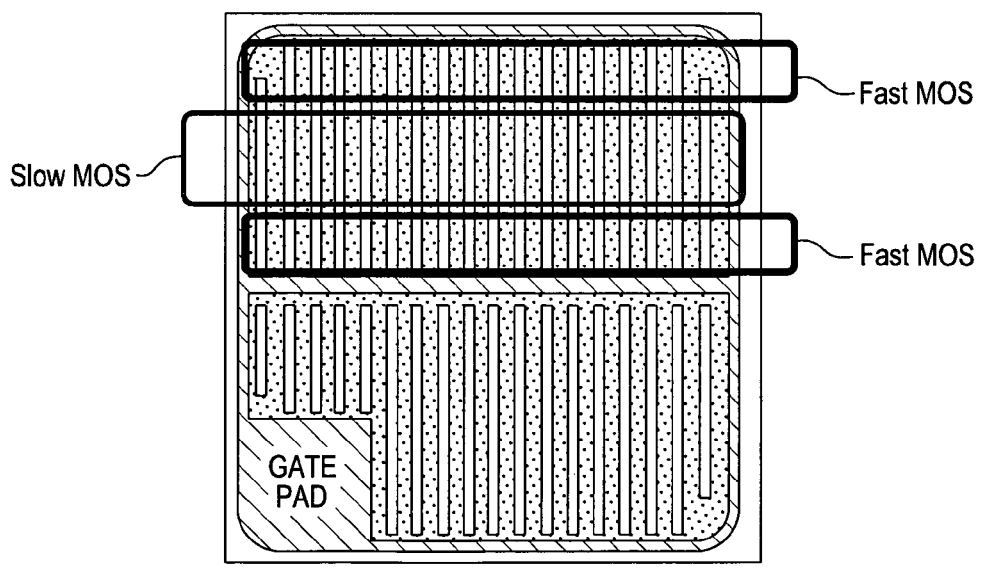
FIGS. 7 and 8 show a schematic layout of two different embodiments of a MOS device according to the prior art.

With reference to such figures, and in particular to the example of FIG. 1, 1 globally and schematically indicates a portion of power MOS device realized according to an embodiment of the present invention.

The device 1 comprises a plurality of elementary MOS transistors 2, arranged in parallel to each other, realized on a silicon wafer comprising a semiconductor layer 4 disposed onto a substrate 3. The layer 4 exhibits a first type of conductivity which, in the case highlighted in the figure, is of the N-type while the substrate 3 is of the N+ type with increased doping.

The elementary MOS transistors 2 shown in the figures are realized with strip-like structures, although this embodiment of the present invention can be applied to devices with elementary MOS transistors having a cellular structure.

The elementary MOS transistors 2 exhibit a body region 5, realized with a second type of conductivity, a source area 6 contained above such body region 5 and an overlying gate oxide 7, which partially covers the body 5 and the source 6 region to define an underlying channel region 7a.

The MOS device 1 exhibits a gate structure 12 comprising a plurality of strips 8 preferably realized with a first conductive material, such as for example polysilicon, arranged above the gate oxide 7 and self-aligned thereto.

Figure 15:
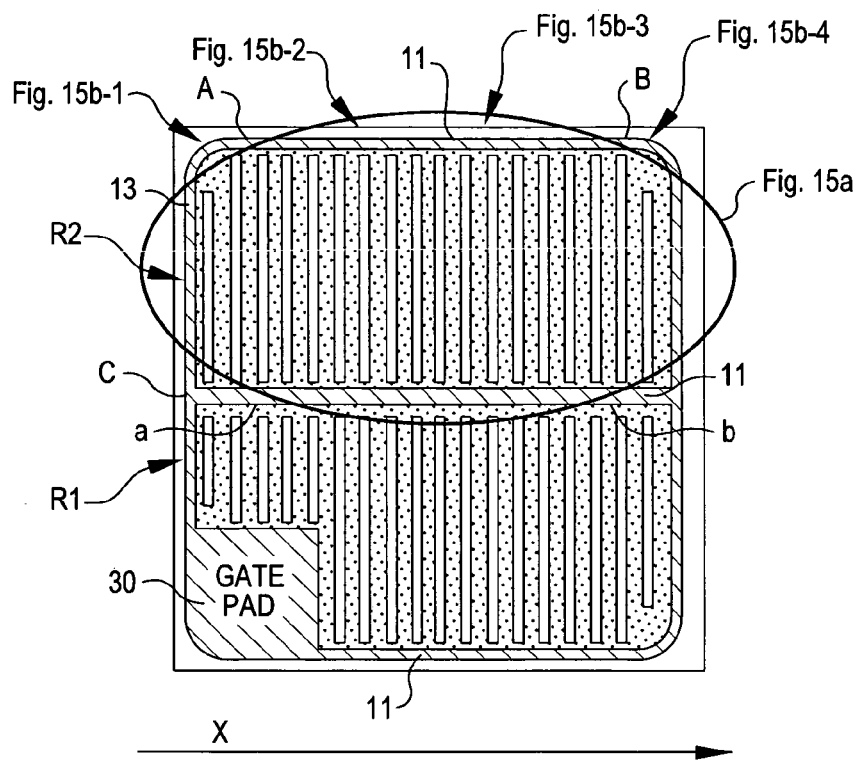
FIG. 15 is a schematic view of an embodiment of the device according to the invention where modifications relative to the known solution of FIG. 9 are highlighted.

The strips 8, according to a standard layout, can be directly connected to a gate pad 30 (FIG. 15), suitably provided on the upper surface of the MOS device 1, or they can be connected thereto by means of a plurality of gate fingers or metallic tracks 11 (FIG. 15).

The gate fingers 11, where present, are realized in particularly conductive material, such as a metal, and they thus quickly transfer each signal coming from the gate pad 30 directly to the plurality of conductive strips 8 and thus to the single elementary MOS transistors 2 electrically connected thereto.

Figure 9:
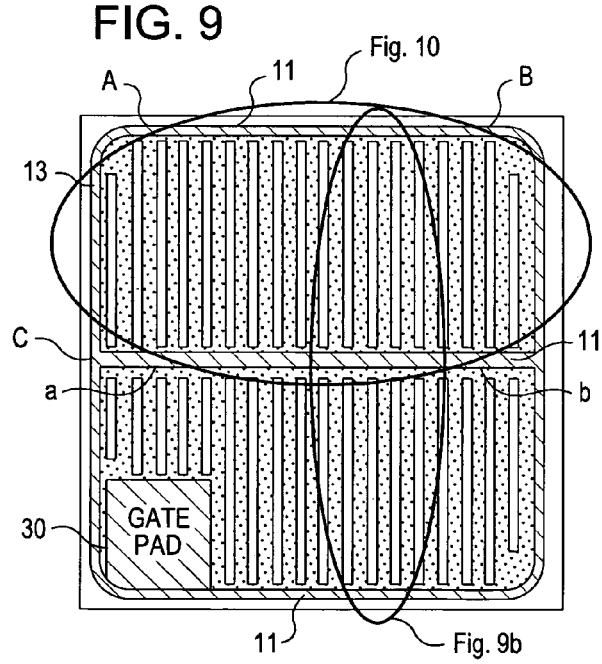
FIGS. 9, 9b and 10 show a further embodiment of a power electronic MOS device according to the prior art with the corresponding equivalent circuit.
Figure 9B:
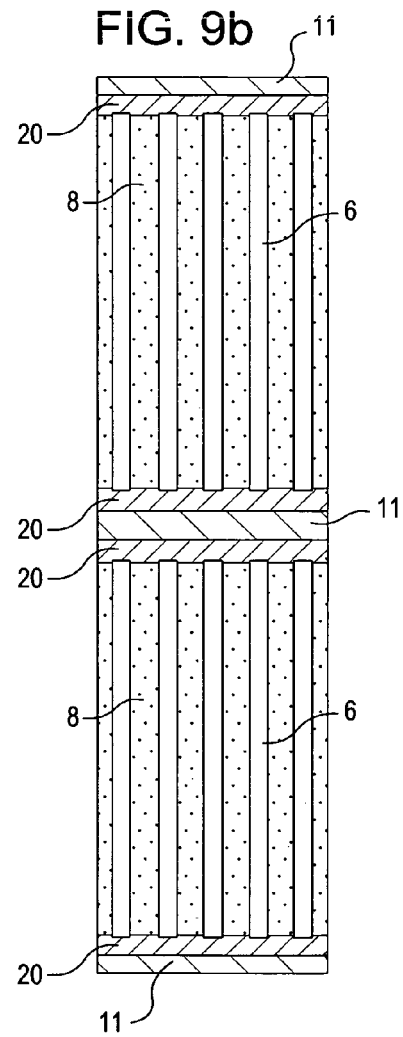
Figure 10:
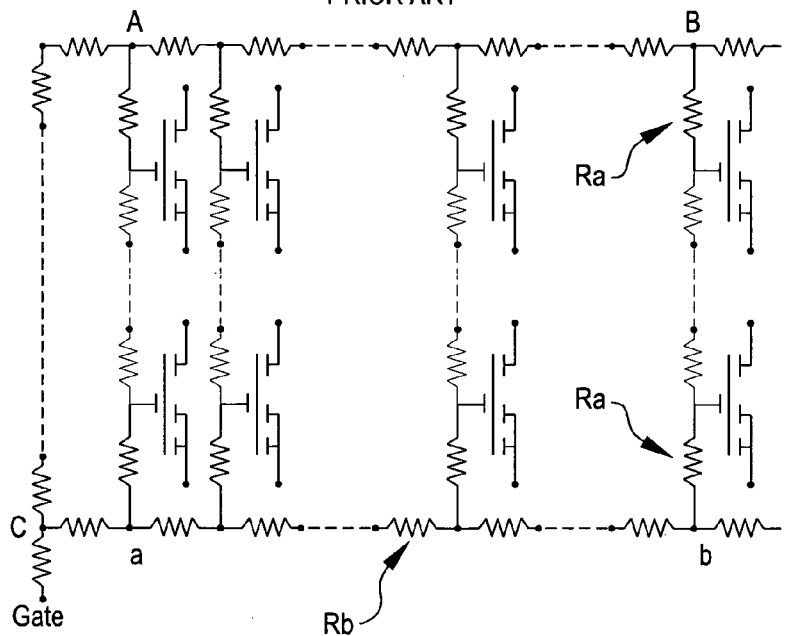

In the embodiment discussed in conjunction with FIG. 9 the gate fingers 11 are three, a central one and two lateral ones and, as well highlighted in the other FIG. 9B, between the gate fingers 11 and the conductive strips 8 there is a connection layer 20 also preferably realized with a conductive material, such as for example polysilicon. This connection conductive layer 20 introduces a further resistive contribution (Ra) in series to the conductive strips 8 (FIG. 10) whose value depends on the number and on the dimensions of the islands 10.

Advantageously, the gate structure 12 has programmable resistivity and it comprises a plurality of independent islands 10 realized with at least a second conductive material. The plurality of islands 10 are formed on an upper surface 9 of said conductive strips 8.

Suitably, the plurality of islands 10 is realized for example with a metallic silicide or by means of ionic implantation of doping species. In one these islands can be realized by means of selective silicidization of the polysilicon.

A further realization could however provide that a group of islands 10, or each island 10 of said plurality, can be realized with a conductive material different from another group or from another island 10.

Each island 10 exhibits, in plan, a polygonal conformation. In the embodiment shown in FIG. 11 each island 10 has a rectangular conformation.

The plurality of islands 10 formed on the upper surface 9 of the strip 8 are aligned along such conductive strip 8 and they exhibit realization parameters of length Co, of width X and of distance p from the preceding island and which, although varying, meet some tolerances as better specified hereafter. The depth of these islands 10 depends on the formation process and may be a fixed parameter inside the device.

Suitably, the plurality of islands 10 formed on the upper surface 9 provide resistances of suitable value to be connected in series and/or in parallel with the conductive strips 8 to compensate their resistive values.

Figure 11:
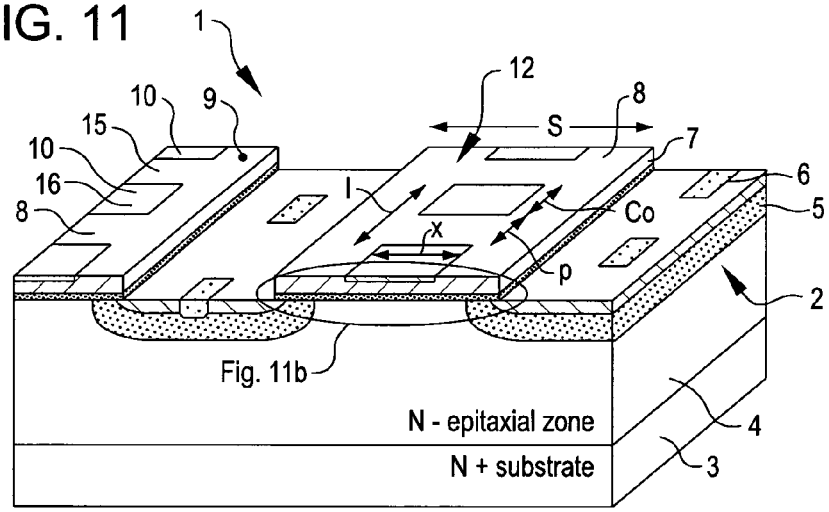
FIGS. 11 and 11b show a portion of a power MOS device realized according to an embodiment of the present invention.
Figure 11B:
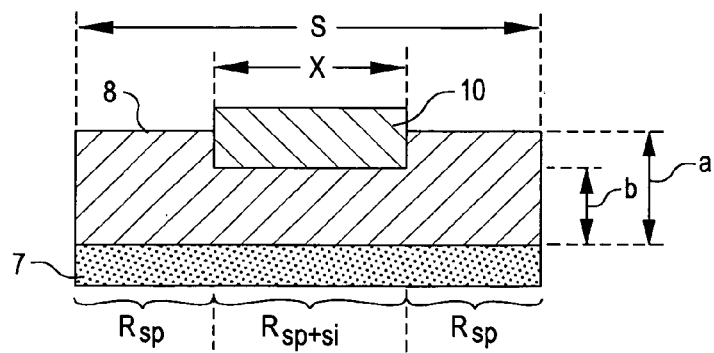

Each island 10 formed on the upper surface 9 of the strip 8 projects therefrom, as shown in the section of FIG. 11b and it abuts a polysilicon layer.

According to different embodiments, each island 10 can be completely contained in the polysilicon layer or wrapped by the polysilicon layer of the conductive strip 8 with an upper surface coplanar with the surface 9 of the strip 8 or realized on the surface 9 of the strip 8.

Naturally, the values of such realization parameters of the islands 10 are be compatible with the technology used and the equipment employed. Moreover, the conductive material with which the islands 10 can be realized can vary according to specific needs, being for example cobalt silicide ($CoSi_2$), platinum silicide (PtSi), titanium silicide ($TiSi_2$) or tungsten silicide ($WSi_2$).

As already said, moreover, the islands 10 can be realized also by means of selective ionic implantation of doping species, which change the resistivity of the polysilicon layer 8 inside the island 10.

However, the islands 10 have a different resistivity with respect to the remaining parts 15 of the conductive strip 8.

Thus, the conductive strip 8 with programmable resistivity will be an alternation between first portions 15 realized in a polysilicon layer and second portions 16 realized by a polysilicon layer and with a silicide layer which defines the island 10.

Figure 12:
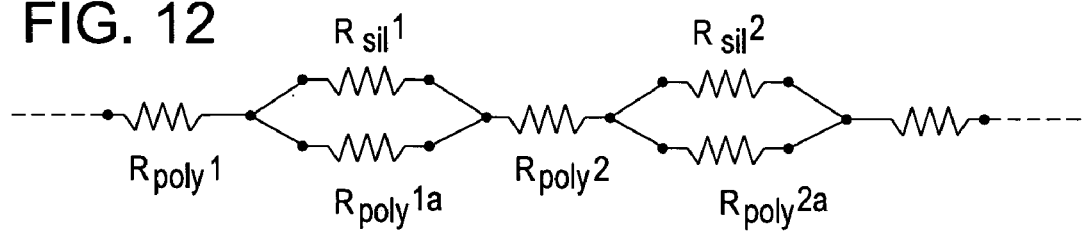
FIG. 12 shows an equivalent circuit of a portion of a gate structure reported in FIG. 11.

From the electric point of view, the resistance of a conductive strip 8, according to an embodiment of the present invention, has an equivalent circuit shown in FIG. 12 and it is considered as a series n, where n is the number of islands (10) suitably formed in said conductive strip (8), of polysilicon resistances $R_{poly}^{1,2,\cdots n}$ of the first portions 15 alternated in parallel between polysilicon resistance $R_{poly}^{1a,2a,\cdots na}$ and silicide $R_{sil}^{1,2,\cdots n}$ of the second portions 16.

In particular, with reference to FIG. 11, the unitary resistance r of a strip element 8 having length l, realized by a first portion 15 and by a second portion 16 being contiguous, will be given by the formula:

$$r = \frac{p}{l} r_p + \frac{Co}{l} r_{Co}$$

wherein:

s is the width of the conductive strip 8 and x is the width of each island 10; it results:

$$\left(\frac{R_{sp}}{s-x} // \frac{R_{spsi}}{x}\right)$$

$r_p$ being the unitary resistance associated with the first portion 15 in the section p of the conductive strip 8, i.e. $r_p = R_{sp}/s$ where $R_{sp}$ is the layer resistance (sheet resistance) of the first portion 15;

$r_{Co}$ being the unitary resistance associated with the second portion 16, section Co of the conductive strip 8, i.e. the parallel between the layer resistance of the polysilicon in the section (s-x) and of silicide+silicon in the section.

As it is well known, the resistance value of each conductive strip 8 influences the time constant of the elementary MOS transistors 2 electrically connected to the strip 8 and in particular the response of the MOS device 1 to each signal coming from the gate pad 30 is influenced.

Advantageously the values of the realization parameters of the islands 10 may be predefined so that each conductive strip 8 responds to each signal coming from the gate pad 30 with a same time constant.

With a simplified analysis it results that the time constant of a conductive strip 8 of length L is equal to (rL)*(cL) where r and c are respectively unitary resistance and capacitance of the strip 8.

Naturally, the unitary capacitance c depends on the width s of the conductive strip 8 and on the thickness of the underlying gate oxide 7 and it is thus substantially a constant according to the technologies used, in particular it will be substantially independent from the islands 10 introduced.

Thus, indicating with $L_{max}$ the length of a longer strip 8, schematically shown in the examples of FIGS. 20 and 21, and with L the one of a shorter strip 8 and wishing to make uniform the time constant RC a relation between the various parameters is attained.

In such case, wishing to speed up the longest strip 8 the islands 10 formed will realize a continuous strip with maximum width and thus with a unitary resistance which will be equal to: $r = r(L_{max}) = r_{Co}$. Thus, imposing the equality between the time constants the following relation is obtained:

$$\frac{p}{l} r_p + \frac{Co}{l} r_{Co} = r(L_{max}) \frac{L_{max}^2}{L^2}$$

Such relation links the realization parameters of the plurality of islands 10 to the ratio between the lengths of the smallest and greatest conductive strips 8.

By using realization parameter, being variable but meeting the above indicated relation, the time constant of the MOS device 1 can be corrected to ratios meeting the following relation:

$$\frac{L_{max}}{L} \leq \sqrt{\frac{r_p}{r_{max}}}$$

In such case according to the geometries typical of the technology used as well as to the resolution of the type of photolithographic equipments used ($L_{max}/L$) values are attained being equal to about 3-5, values which allow to obtain a good definition of the time constant and thus of the response of the power MOS device 1 to the external stresses.

Naturally, as above highlighted, the islands 10 can have correlated realization parameters and variable arrangements. In particular, according to a second embodiment, as highlighted in FIG. 13, the islands 10 can be contiguous with at least one attached side, thus forming a continuous strip 25 along the conductive strip 8.

According to such embodiment, the variable dimensional parameter of each island 10 is the width X of the continuous strip 25.

In particular, wishing to make uniform all the time constants of the conductive strips 8, which realize the gate structure 12 of the power MOS device 1, and the time constants being, as known, a function of RC, where R is the resistance and C the capacitance, it is possible to vary the width of the continuous strip 25, for example by increasing the width X to make the shortest strips 8 become slower.

Figure 13:
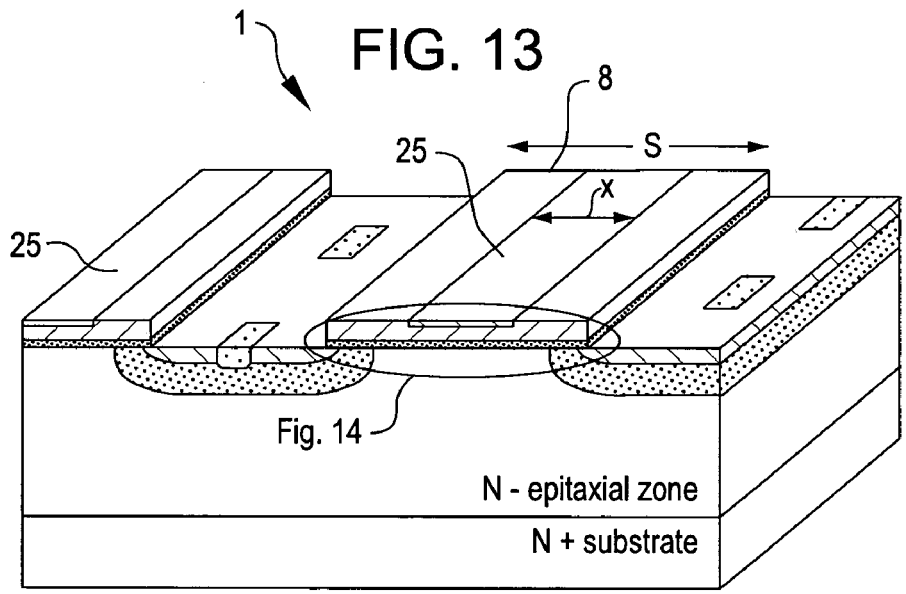
FIGS. 13 and 14 show a portion of a further embodiment of a power MOS device according to an embodiment of the present invention.
Figure 14:
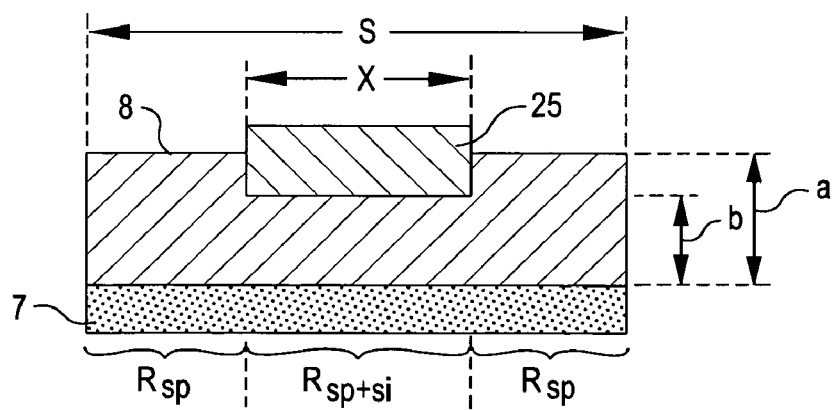

In the simplified example highlighted in FIG. 13, the unitary resistance r is given by the parallel between:

the resistance of a polysilicon unitary portion, given by the ratio:

$$\left(\frac{R_{sp}}{s-x}\right)$$

wherein (s-x) is the width of the conductive strip 8 realized in a polysilicon layer of thickness a and $R_{sp}$ is the resistance of such layer, as highlighted in FIG. 14;

and of the unitary resistance of the conductive strip portion 8 comprising the continuous strip 25 given by the ratio:

$$\left(\frac{R_{spsi}}{x}\right)$$

wherein $R_{spsi}$ is the resistance of the polysilicon layer with reduced thickness b and the overlapped silicide layer, while x is the width of the continuous strip 25.

Carrying out thus the calculation of the parallel value of the unitary resistance is equal to:

wherein $L_{max}$ is the maximum length of the conductive strips 8 and $x_{max}$ is the greatest $$r = \frac{R_{sp} \cdot R_{spsi}}{x \cdot R_{sp} + (s-x) \cdot R_{spsi}}$$

width of the continuous strip 25 formed therein, this latter value depending on the technologies used, and imposing the equality of the time constants with any strip 8 of parameters: L of length and x of width of the continuous strip 25, the following relation will result:

wherein $R_{sp}$, is a resistance of the strip portion 8 of the polysilicon layer with thickness a, will $$x = \frac{1}{R_{sp} - R_{spsi}} \left\{ \frac{L^2}{L_{max}^2} \cdot [x_{max} \cdot R_{sp} - (s - x_{max}) \cdot R_{spsi}] - s \cdot R_{spsi} \right\}$$

typically have values of about 30-45 Ohm/$_{[square]}$, $R_{spsi}$ is a resistance of the strip portion 8 realized by the parallel of the polysilicon layer with reduced thickness b and of the overlapped silicide layer of the continuous strip 25, will typically have values of about 0.5-5 Ohm/$_{[square]}$ s is the width of the conductive strip 8.

Such solutions allow to solve, or however to attenuate, the unevenness effect of the gate resistance of the single elementary MOS due to the different length of the conductive strips 8 (see the case reported in FIG. 8).

From the electric point of view, the power MOS device 1 in the case shown in FIG. 9 exhibits the three gate fingers 11 which, being realized as metallic tracks, add resistances (Rb in FIG. 10) in series to the resistances of the conductive strips 8 which may, separately according to their dimensions, introduce, according to prior art, resistance values equal to 0.3-7 Ohm.

Since it is not possible to void such resistive contributions, a second embodiment of the present invention compensates the effect of this contribution of each gate finger 11 so as to make more uniform the resistive contribution seen from all the series of elementary MOS (strip 8) connected thereto.

Figure 15A:
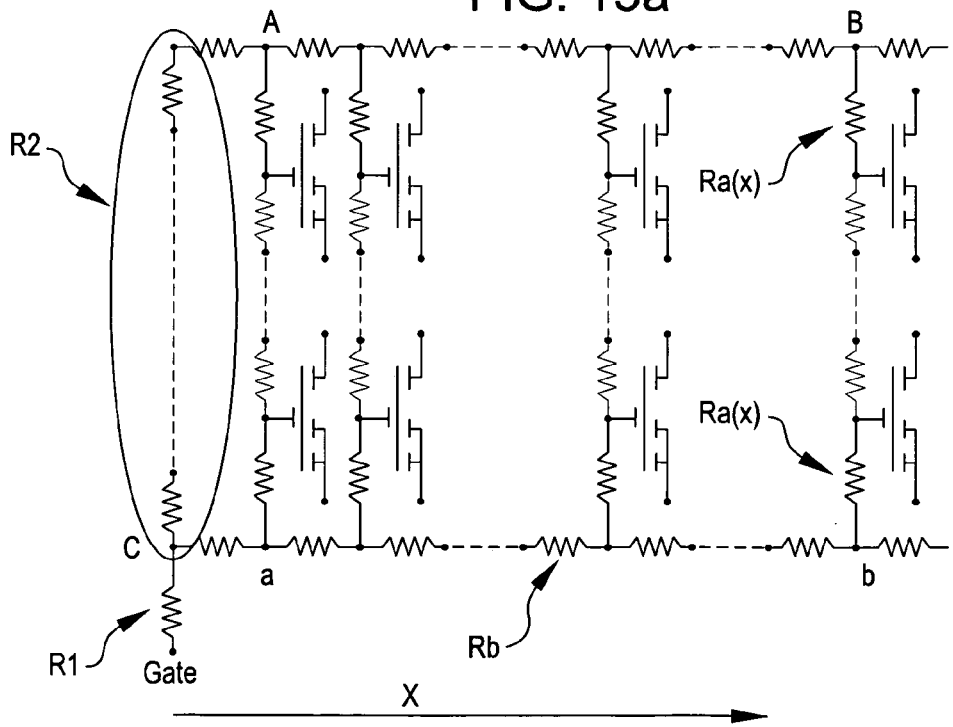
FIGS. 15a and 15c show an equivalent electric scheme in detail (FIG. 15a) and in blocks (FIG. 15c) of a gate mesh of the device discussed in conjunction with FIG. 15.

According to an embodiment of the present invention, for reducing the unevenness of the gate resistance generated due to the resistances introduced by the gate fingers 11, between each gate finger 11 and one or more conductive strips 8, resistances (Ra(x)) are realized whose value depends on the distance x from the gate pad or from the start of the gate finger (FIG. 15a). FIG. 15c reports a block equivalent electric scheme of the device of FIG. 15 wherein the resistances of the gate fingers (Rb) and the additional ones of the connection layer 20 are highlighted whose value depends on the position.

Such resistances, also called balance resistances and realized in the connection layer 20 (FIG. 9b), compensate the different resistive contribution of the gate fingers 11 according to the distance x from the gate pad 30.

The variable resistances Ra(x) are realized in the connection layer 20 by introducing islands 10 with different resistivity with respect to the remaining conductive area. These islands can have different shapes as shown, only by way of example, in the series of FIGS. 17, 18 and 19.

A determinant characteristic is that one or more geometric parameters can vary according to the distance x influencing, in a known way, the resistive contribution Ra(x).

For example, FIG. 15 shows a layout of a power MOS device 1 comprising a gate pad 30 connected to two vertical arms 13 with resistance R1 and R2, two external gate fingers 11 and an inner gate finger 11 whose incremental resistances are indicated as $R_b$.

Naturally, the total value of the resistances, $R_b$, depends on the distance x from a reference, which can be the gate pad 30 or an edge with respect to which the gate pad 30 is realized. In the case shown in FIG. 15 the reference is the left edge of the wafer/die whereon the power MOS device 1 is realized.

Figures 4, 15B:
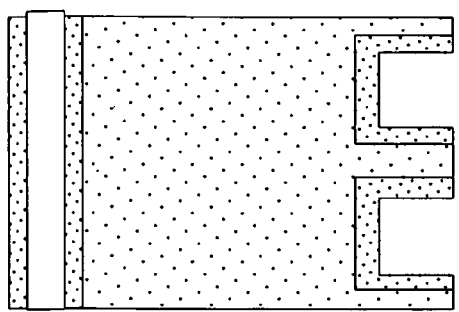
FIG. 15b shows, only by way of example, how it is possible to realize connection layers with variable resistance according to an embodiment of the present invention.
Figures 3, 15B:
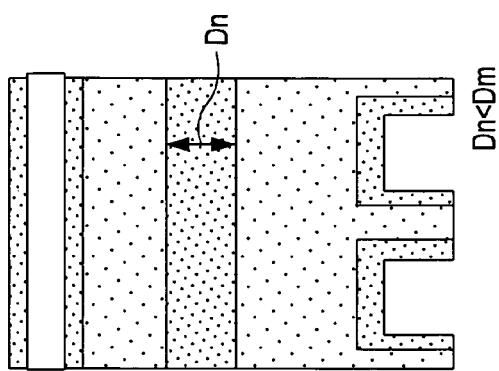
Figures 2, 15B:
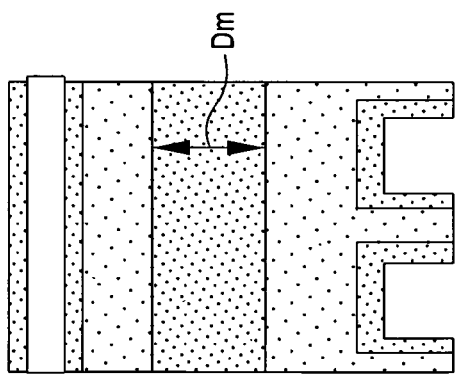
Figures 1, 15B:
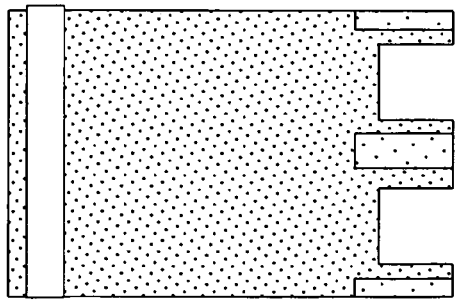
Figure 15C:
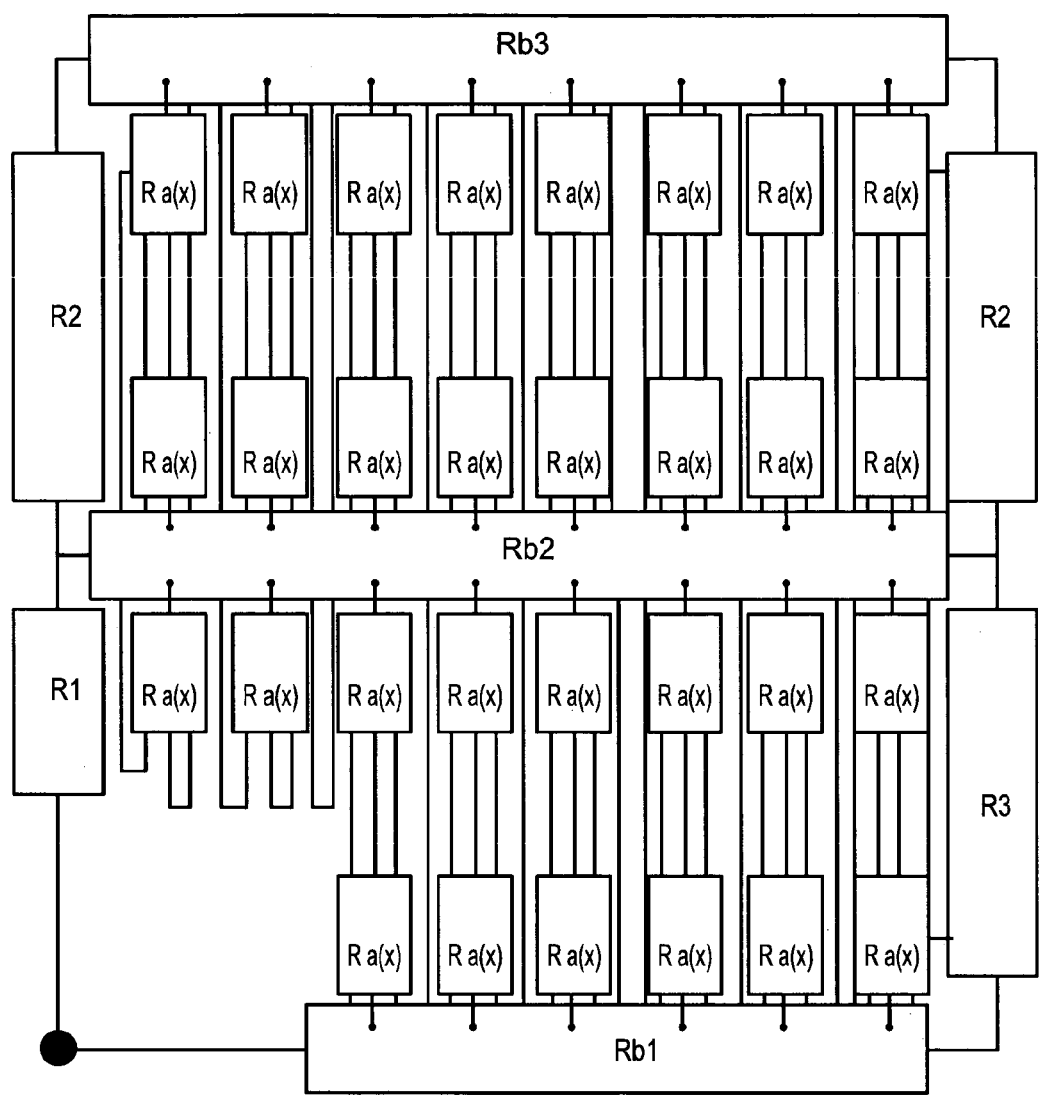

An example of how the structure of the connection layer 20 varies when the distance x varies is reported in FIG. 15b.

In such representation (FIG. 15a) Ra(x) indicates the resistances introduced into the connection layers 20 with the suitable islands 10 formed therein which compensate the different resistance of the gate finger 11 according to the distance x from the left edge of the plate.

Figure 16:
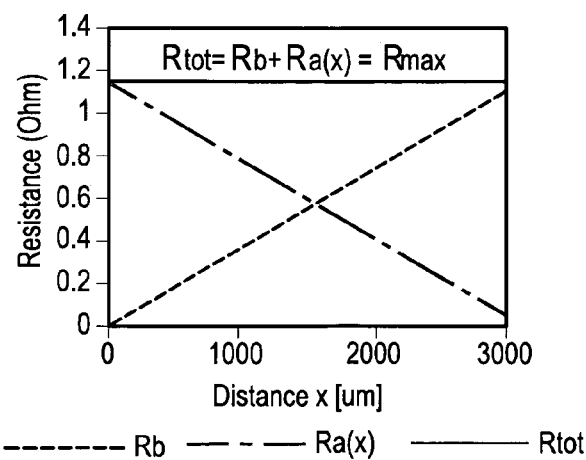
FIG. 16 shows a diagram showing the resistance of a gate finger as a function of the length and showing a compensation resistance.

Advantageously, according to an embodiment of the present invention, the value of the resistance Ra(x) is chosen so as to exactly compensate the highest value of the resistive contribution of the gate finger 11, as schematized in the diagram reported in FIG. 16.

In such way the value of the series between the resistance Ra(x) and the resistance introduced by the gate finger to that position x will be constant and equal to the highest resistance. Thus the value of Ra(x), although depending on the distance x from the reference, will be highest for x=0 and minimum for x=$x_{max}$.

Then, for carrying out the compensation of the resistive value of the gate finger Rb one singles out the farthest point in resistive terms from the gate pad 30, so as to fix the highest resistance value (Rmax) to be compensated.

It is thus possible to calculate $R_a$(x) imposing that the value of the resistance to be compensated, due to the gate finger 11, both equal to Rmax, i.e. that:

$$R(x=0)+R_b x+R_a(x)=R\text{max}$$

wherein:

R(x=0) is the resistance in series on the branch coming from the gate pad considered for x=0 (for example for the edge R(x=0)=$R_1$+$R_2$, while for the central gate finger 11 (R(x=0)= $R_1$).

$R_b$ x is the product between the unitary resistance of the conductive layer forming the gate finger and the distance x from the reference side and it represents the resistive value introduced by the gate finger to that position.

Thus, making explicit with respect to Ra(x) the relation is obtained:

$$R_a(x)=R\text{max}-[R(x=0)+R_b x]$$

Naturally, the resistance value Ra, equal to the value of resistance Ra(x) which can be calculated with the above indicated formula according to the distance x, is realized in series to one or to more conductive strips 8 in correspondence with the connection layer 20.

Figure 18:
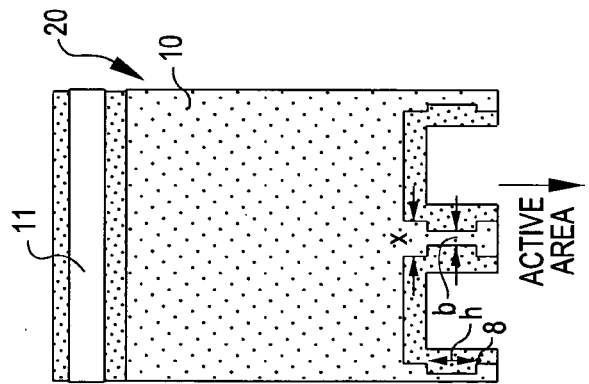
Figure 18A:
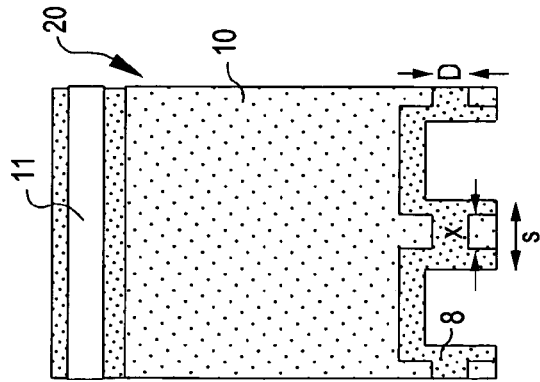

In an embodiment indicated in FIG. 18a, the resistance Ra can be realized in the connection layer 20 which connects two strips 8 to the gate finger 11, by means of the formation of two independent islands 10, realized transversally to the connection layer 20 and placed at a distance D.

Such connection layer 20, with the two islands 10, exhibits an additional resistance $R_a$ of value equal to:

$$R_a = \frac{D}{L_a}(R_{sp} - R_{spsi})$$

wherein:

$L_a$ is the width of the connection layer 20 and in such case also of the islands 10;

D is the distance between the two islands and $R_{sp}$ the resistance of the connection layer 20 realized only in polysilicon;

$R_{spsi}$ is the resistance of the connection layer 20 realized as overlapping between the polysilicon layer and the islands (10) realized with silicide.

According to a further embodiment the value of Ra can be obtained according to the example indicated in FIG. 19a.

Advantageously, the islands 10 formed on the upper surface of the connection layer 20, are partially connected to each other to form a structure 21 which exhibits a substantially H-like conformation in plan comprising a central portion 22 and two transversal portions 23.

Indicating with h the height and b the width of the central portion of the structure 21;

$L_a$ the width of the connection layer;

$R_{sp}$ the resistance of the parts of connection layer 20 realized only in polysilicon, which, according to the present embodiment, are two parts 24 lateral to the central portion 21;

$R_{spsi}$ the resistance of the connection layer 20 with the structure 21 realized with silicide overlapped;

a resistance value Ra or additional one is obtained equal to $$R_a = h \cdot R_{spsi} \left[ \frac{R_{sp}}{bR_{sp} + (L_a - b)R_{spsi}} - \frac{1}{L_a} \right]$$

Thus, advantageously by predefining the values of height h, width b of the structure 21 of islands 10, and $L_a$ width of the connection layer 20 suitable additional resistances $R_a$ of predetermined value can be realized.

Figure 17:
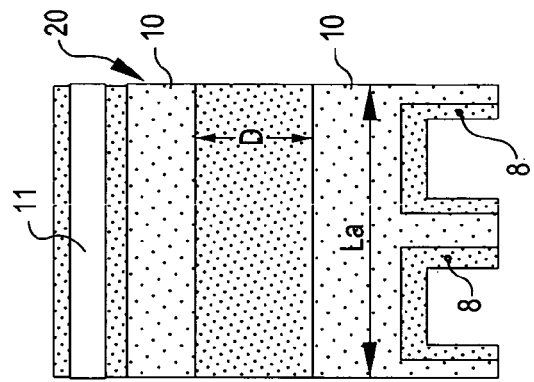
Figure 17A:
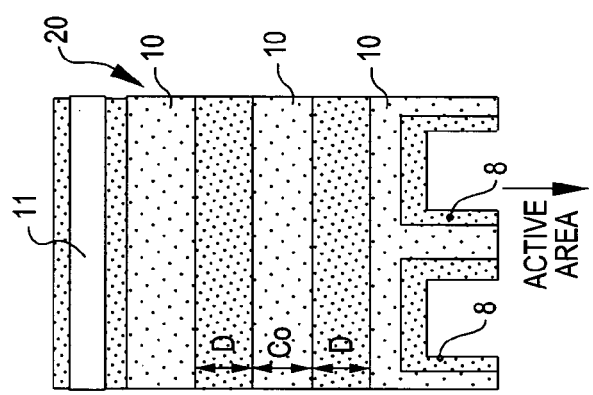

The shapes taken by the islands 10 and the cutting or narrowing positions can be obviously different according to the design needs. FIGS. 17 to 19 show in fact only an example.

The leading idea is that of introducing in the area 20 a resistance whose value varies inside the device so as to compensate the resistive contribution, or better, being dynamic stresses, the impedance introduced by the gate fingers.

These resistances inside the area 20 can be realized by suitably modifying the shape and/or the number of the islands 10 of conductive material.

The power MOS device 1, according to an embodiment of the present invention, thus allows realization of a gate structure 12, comprising conductive strips 8 and possible structures 20 for connection to the gate fingers 11, with variable resistivity according to the islands 10 being formed which allow to suitably modify the gate global resistivity.

The dimensional parameters with which the islands 10 are realized are correlated with the elementary MOS positions inside the device, and the above indicated relations represent only an example.

In particular plural islands 10 may be introduced whose resistances will be in series or in parallel to the resistances of the conductive strips 8, thus improving the time constant of each conductive strip 8 and making uniform the response of the power MOS device 1 to each signal coming from the gate pad 30.

An improvement may thus obtained of the dynamic operation of the power MOS device which will be programmable on the basis of the dimensional values of the islands inserted.

A further advantage of an embodiment of the present invention is due to the fact that having the gate structure 12 a regulable resistivity, according to the dimensions and the material of the islands 10 formed, there is a substantially uniform gate resistance to each elementary MOS transistor 2 and this allows a uniform time constant RC of the power MOS device 1 thus ensuring a controlled switching also at high operation frequencies.

More in particular, the power MOS device realized by an embodiment of the present invention, with a gate structure having programmable resistivity improves and balances the dynamic response to the signals coming from the gate pad.

A MOS devices 1 described above may be part of a larger integrated circuit, which may be part of an electronic system such as the electronic system of an automobile.

From the foregoing it will be appreciated that, although specific embodiments of the invention have been described herein for purposes of illustration, various modifications may be made without deviating from the spirit and scope of the invention.

What is claimed is:

1. An MOS device, comprising:
a drain region;
a body region disposed over the drain region and having a mid portion and an edge portion;
a source region disposed over the mid portion of the body region;
a gate disposed over the drain region and the edge portion of the body region, the gate including a first region having a first resistivity and a second region having a second resistivity that is different than the first resistivity;
a gate pad; and
wherein a dimension of one of the first and second regions is proportional to a first distance of the one region from the gate pad.

2. The MOS device of claim 1 wherein:
the first region is disposed within the second region; and
the first resistivity is smaller than the second resistivity.

3. The MOS device of claim 1 wherein:
the first region comprises a silicide; and
the second region comprises polysilicon.

4. The MOS device of claim 1 wherein the gate includes a third region having substantially the first resistivity and separated from the first region by the second region.

5. The MOS device of claim 1 wherein the gate includes a third region having substantially the first resistivity, separated from the first region by the second region, and having a dimension that is different from a corresponding dimension of the first region.

6. The MOS device of claim 1 wherein the dimension is a dimension of the first region.

7. The MOS device of claim 1 wherein:
the dimension is a dimension of a portion of the second region that is contiguous with the first region and;
the first distance is the distance of the portion of the second region from the gate pad.

8. The MOS device of claim 1, further comprising:
a gate connector disposed between the gate pad and the gate; and
wherein the dimension is a dimension of the first region and is related to a second distance of the first region from the gate connector.

9. The MOS device of claim 1, further comprising:
a gate connector disposed between the gate pad and the gate; and
wherein the dimension is a dimension of a portion of the second region that is contiguous with the first region and is related to a second distance of the portion of the second region from the gate connector.

10. An integrated circuit, comprising:
a MOS device, including,
a drain region,
a body region disposed over the drain region and having a mid portion and an edge portion,
a source region disposed over the mid portion of the body region,
a gate having a gate resistance, the gate being disposed over the drain region and the edge portion of the body region, the gate including a first region having a first resistivity and a second region having a second resistivity that is different than the first resistivity,
a gate pad, and
wherein the gate resistance is inversely proportional to a distance of one of the first and second regions from the gate pad.

11. A system, comprising:
a MOS device, including,
- a drain region,
- a body region disposed over the drain region and having a mid portion and an edge portion,
- a source region disposed over the mid portion of the body region,
- a gate having a gate resistance, the gate being disposed over the drain region and the edge portion of the body region, the gate including a first region having a first resistivity and a second region having a second resistivity that is different than the first resistivity,
- a gate pad,
- wherein the gate resistance varies monotonically with a first distance of one of the first and second regions from the gate pad.

12. A MOS device, comprising:
a drain region;
a body region disposed over the drain region and having a mid portion and an edge portion;
a source region disposed over the mid portion of the body region;
a gate disposed over the drain region and the edge portion of the body region, the gate including a first region having a first resistivity and a second region having a second resistivity that is different than the first resistivity;
a gate pad; and
wherein as the distance from the first region to the gate pad increases, the magnitude of a dimension of one of the first and second regions increases, and the magnitude of a dimension of the other of the first and second regions decreases.

* * * * *